US012028958B2

(12) United States Patent
Ellwi et al.

(10) Patent No.: US 12,028,958 B2
(45) Date of Patent: Jul. 2, 2024

(54) HIGH-BRIGHTNESS LASER PRODUCED PLASMA SOURCE AND METHOD OF GENERATION AND COLLECTION RADIATION

(71) Applicants: Isteq B.V., Eindhoven (NL); RnD-ISAN, Ltd, Moscow (RU)

(72) Inventors: Samir Ellwi, Crawley (GB); Denis Aleksandrovich Glushkov, Nieuwegein (NL); Vladimir Vitalievich Ivanov, Moscow (RU); Oleg Borisovich Khristoforov, Moscow (RU); Konstantin Nikolaevich Koshelev, Moscow (RU); Mikhail Sergeyevich Krivokorytov, Moscow (RU); Vladimir Mikhailovich Krivtsun, Moscow (RU); Aleksandr Andreevich Lash, Moscow (RU); Vyacheslav Valerievich Medvedev, Moscow (RU); Aleksandr Yurievich Vinokhodov, Moscow (RU)

(73) Assignees: ISTEQ B.V., Eindhoven (NL); ISTEQ GROUP HOLDING B.V., Eindhoven (NL)

( * ) Notice: Subject to any disclaimer, the term of this patent is extended or adjusted under 35 U.S.C. 154(b) by 436 days.

(21) Appl. No.: 17/569,737

(22) Filed: Jan. 6, 2022

(65) Prior Publication Data

US 2022/0132647 A1 Apr. 28, 2022

Related U.S. Application Data

(63) Continuation-in-part of application No. 16/952,587, filed on Nov. 19, 2020, now Pat. No. 11,252,810,
(Continued)

(30) Foreign Application Priority Data

Nov. 24, 2017 (RU) .......................... RU2017141042
Apr. 26, 2019 (RU) .......................... RU2019113052
(Continued)

(51) Int. Cl.
*H05G 2/00* (2006.01)
*G03F 7/00* (2006.01)

(52) U.S. Cl.
CPC ......... *H05G 2/005* (2013.01); *G03F 7/70033* (2013.01); *G03F 7/70166* (2013.01); *G03F 7/70916* (2013.01); *H05G 2/008* (2013.01)

(58) Field of Classification Search
CPC .... H05G 2/005; H05G 2/008; G03F 7/70033; G03F 7/70166; G03F 7/70916
See application file for complete search history.

(56) References Cited

U.S. PATENT DOCUMENTS

2008/0157006 A1\* 7/2008 Wilhelmus Van Herpen .............
G03F 7/70858
250/492.2

\* cited by examiner

*Primary Examiner* — Nicole M Ippolito
*Assistant Examiner* — Hanway Chang
(74) *Attorney, Agent, or Firm* — Nadya Reingand

(57) ABSTRACT

A laser produced plasma light source comprises a vacuum chamber with a rotating target assembly supplying a target into an interaction zone with focused laser beam. The target is layer of a fluid and/or free-flowing target material on a surface of annular groove in the rotating target assembly. An output beam of short-wavelength radiation exits the interaction zone to an optical collector through the means for debris mitigation. A linear velocity of the target is not less than 100 m/s and a vector of the linear velocity of the target in the interaction zone is directed on one side of a plane passing through the interaction zone and the rotation axis
(Continued)

while the focused laser beam and the output beam are located on another side of said plane. The optical collector comprises two ellipsoidal mirror units arranged in a tandem.

20 Claims, 5 Drawing Sheets

Related U.S. Application Data which is a continuation-in-part of application No. 16/773,240, filed on Jan. 27, 2020, now Pat. No. 10,887,973, which is a continuation-in-part of application No. 16/535,404, filed on Aug. 8, 2019, now Pat. No. 10,588,210, which is a continuation-in-part of application No. 16/103,243, filed on Aug. 14, 2018, now Pat. No. 10,638,588.

(30) Foreign Application Priority Data

| | | |
|---|---|---|
| Jan. 25, 2020 | (RU) | RU2020103063 |
| Sep. 4, 2020 | (RU) | RU2020129329 |
| Nov. 3, 2021 | (RU) | RU2021132150 |
| Dec. 13, 2021 | (RU) | RU2021136734 |

HIGH-BRIGHTNESS LASER PRODUCED PLASMA SOURCE AND METHOD OF GENERATION AND COLLECTION RADIATION

CROSS-REFERENCE TO RELATED APPLICATIONS

This patent application is a Continuation-in-part of U.S. patent application Ser. No. 16/952,587 filed Nov. 19, 2020, which in turn is a Continuation-in-part of U.S. patent application Ser. No. 16/773,240 filed Jan. 27, 2020, which in turn is a Continuation-in-part of U.S. patent application Ser. No. 16/535,404, filed on Aug. 8, 2019, which in turn is a Continuation-in-part of U.S. patent application Ser. No. 16/103,243, filed on Aug. 14, 2018, with priority to Russian patent application RU2017141042 filed Nov. 24, 2017, the present application also claims priority to Russian patent application RU2021136734 filed Dec. 13, 2021 and Russian patent application RU2021132150 filed Nov. 3, 2021, all of which are incorporated herein by reference in their entireties.

FIELD OF INVENTION

The invention relates to high-brightness laser-produced plasma (LPP) light sources designed to generate soft X-ray, extreme ultraviolet (EUV) and vacuum ultraviolet (VUV) radiation at wavelengths of approximately 0.4 to 120 nm, which provide highly effective debris mitigation to ensure the long-term operation of the light source and its integrated equipment, and to methods for generating and collecting radiation in a large solid angle with transmission of the image of emitting plasma region without aberrations into the remote focus of an optical collector.

BACKGROUND OF INVENTION

High-brightness light sources for generating short-wavelength radiation including X-ray, EUV and VUV are used in many fields: microscopy, materials science, biomedical and medical diagnostics, materials testing, crystal and nanostructure analysis, atomic physics, and lithography. These sources are the basis of the analytical base of modern high-tech production and one of the main tools in the development of new materials and products based on them.

The light generation in these spectral ranges is most effective with the use of laser-produced plasma. During the light generation, debris particles are produced as a by-product, which can degrade the surface of optical collector comprising one or several mirrors located near the light source. The debris can be in the form of high-energy ions, neutral atoms and clusters of target material. While deposition of microdroplets and particles on the collector mirror reduce its reflection, high-velocity particles can damage the collector mirror and, possibly, other parts of the optical system located downstream the collector mirror. This determines the relevance of developing high-brightness short-wavelength light sources with highly effective debris mitigation.

In patents RU2670273 published Oct. 22, 2018, RU2709183 published Apr. 26, 2019 and RU2743572 published Feb. 20, 2021 a new approach has been proposed for the development of high-brightness low-debris LPP light sources based on fast rotating liquid metal target, which provides high-efficient debris mitigating by redirecting of droplet fraction of debris particles away from optical collector and input window for laser beam.

However, the use of only a liquid metal target limits a set of target materials for efficient light generation in various spectral bands. Moreover, in these LPP light sources an optical collector based on multilayer normal incidence mirrors has been used. The disadvantage is that such mirrors allow collecting short-wave radiation in a relatively narrow spectral band, defined by the wavelength dependence of the mirror's reflection. For example, when tin or a tin-bearing alloy is used as the target material, plasma radiates most efficiently in the spectral band of around 13.5 nm and while the full spectral band of plasma radiation is around 6-7 nm, the spectral bandwidth of a single mirror is only about 0.54 nm at maximum reflectance. Another drawback of an optical collector based on normal incidence mirrors is due to the complexity of combining the requirement of a large collection angle with high efficient debris mitigating. In the case of a large collection angle the region, where the means for debris mitigation are placed, has limited dimensions which negatively affect their efficiency. Moreover, if it is necessary to obtain in an intermediate focus an image of the source with the size close to the size of the emitting plasma, a highly complex in manufacture and expensive aspherical mirror has to be used as the normal incidence collector mirror, the manufacturing complexity and price of which grow disproportionally with the increase of the mirror size.

These drawbacks are overcome in an optical collector comprised of two ellipsoidal mirror units arranged in a tandem which is used in discharge-produced plasma (DPP) EUV light source, known from U.S. Pat. No. 6,566,668 issued May 20, 2003.

This source used means for debris mitigation based exclusively on the counterflow of protective gas, hereinafter referred to as protective gas flow, which has a poor efficiency in terms of protecting the optical collector against the debris particles formed due to erosion of the source electrodes. Moreover, electrode erosion dramatically reduces the lifetime of a DPP light source. Another drawback of DPP light source is a relatively low pulse repetition frequency (a few kilohertz) which significantly restricts the application field of such sources. Also, a critical drawback of DPP light sources consists in a relatively large size of radiating plasma region (over 200 μm). Firstly, this prevents the achievement of high brightness of a source, and, secondly, is unacceptable for a range of applications, in particular, for X-ray and EUV microscopy.

SUMMARY OF THE INVENTION

Accordingly, there is a need to eliminate the drawbacks mentioned above. In particular, there is a need for an improved LPP sources of soft X-ray, EUV and VUV radiation that are compact and provide a highly efficient, preferably an almost complete, debris mitigation using a wideband large collection angle optical collector of relatively simple design.

This need is met by the features of the independent claims. The dependent claims describe embodiments of the invention.

According to an embodiment of the invention, there is provided a method of generating and collecting radiation, comprising: forming under an action of a centrifugal force of a target as a layer of target material on a surface of annular groove, implemented in a rotating target assembly with target surface facing an rotation axis; irradiating at a high pulse repetition rate the target by a focused laser beam passing through a means for debris mitigation; generating the laser produced plasma in an interaction zone and exiting an output beam of short-wavelength radiation into an optical collector through the means for debris mitigation.

The method is characterized in that the target is rotated at a high linear velocity, not less than 100 m/s, so that most of ejected debris particles and a vector of the linear velocity of the target in the interaction zone to be directed on one side of a plane passing through the interaction zone and the rotation axis, while the irradiating of the target and collecting radiation from the laser produced plasma are provided so that the focused laser beam and the output beam are located on another side of said plane.

In a preferred embodiment of the invention, a spatial distribution of a debris ejection rate from the interaction zone is calculated and directions of a passage of both focused laser beam and the output beam are selected in spatial regions with low debris ejection rates.

In a preferred embodiment of the invention, spatial regions of the passage of both focused laser beam and the output beam are selected so that a debris ejection rates in said spatial regions are at least $10^4$ times less than a maximum debris ejection rate.

In a preferred embodiment of the invention, the short-wavelength radiation is collected by the optical collector comprised of two ellipsoidal mirror units arranged in a tandem that transmits an image of the emitting plasma region without distortions, on a scale determined by a design of said units, into a second focal point of a second ellipsoidal mirror unit while a second focal point of a first ellipsoidal mirror unit is located in a first focal point of the second ellipsoidal mirror unit.

In an embodiment, the debris mitigation is provided along an entire path of the short-wavelength radiation to the optical collector.

In a preferred embodiment of the invention, the debris mitigation is provided by one or more debris mitigation techniques, comprising: protective gas flow, a magnetic mitigation, a foil trap, a debris shield, a membrane largely transparent for short-wavelength radiation, with a transparency of more than 60%.

In a preferred embodiment of the invention, the target is rotated with a centrifugal acceleration of not less than 3000 g, where g is a gravitational acceleration, the target material has fluidity under centrifugal force, and the target surface is parallel to the rotation axis.

In another aspect, the invention relates to a laser produced plasma light source, comprising: a vacuum chamber, a rotating target assembly supplying a target into an interaction zone with a pulsed laser beam focused onto the target which is a layer of target material on a surface of annular groove implemented in a rotating target assembly with a target surface facing an rotation axis, an output beam of short-wavelength radiation exiting the interaction zone to an optical collector, and means for debris mitigation.

The source is characterized in that a linear velocity of the target is not less than 100 m/s, a vector of the linear velocity of the target in the interaction zone is directed on one side of a plane passing through the interaction zone and the rotation axis, while the focused laser beam and the output beam are located on another side of said plane.

In another aspect, the invention relates to a laser produced plasma light source, comprising: a vacuum chamber, a rotating target assembly supplying a target into an interaction zone with a pulsed laser beam focused onto the target which is a layer of target material on a surface of annular groove implemented in a rotating target assembly with a target surface facing an rotation axis, an output beam of short-wavelength radiation exiting the interaction zone to an optical collector, and means for debris mitigation, wherein the target material has fluidity under centrifugal force and belongs to a group comprising: liquid, for example, molten metal; powder, for example, metal powder or mixtures thereof.

In a preferred embodiment of the invention, the target is formed at centrifugal acceleration of at least 3000 g and a surface of the target is parallel to the rotation axis.

In an embodiment of the invention, the target material comprises a centrifuged mixture of a powder, material of which is arranged for laser plasma producing and a liquid or a melt, the density of which is greater than the density of the powder material.

In another aspect, the invention relates to a laser produced plasma light source, comprising: a vacuum chamber, a rotating target assembly supplying a target into an interaction zone with a pulsed laser beam focused onto the target which is a layer of target material on a surface of annular groove implemented in a rotating target assembly with a target surface facing an rotation axis, an output beam of short-wavelength radiation exiting the interaction zone to an optical collector, and means for debris mitigation, wherein an optical collector comprises two ellipsoidal mirror units arranged in a tandem along a path of the output beam, while the means for debris mitigation are located along the entire path of the short-wave radiation into the optical collector.

In a preferred embodiment of the invention, an optical collector comprises two ellipsoidal mirror units arranged in a tandem along a path of the output beam, while the means for debris mitigation are located along the entire path of the short-wavelength radiation into the optical collector.

In a preferred embodiment of the invention, the interaction zone is located in a first focal point of the first ellipsoidal mirror unit and a first focal point of the second ellipsoidal mirror unit is located in a second focal point of the first ellipsoidal mirror unit.

In an embodiment of the invention, the second ellipsoid mirror unit is several times, from 2 to 15 times, smaller than the first ellipsoid mirror unit and the optical collector has magnification close to 1, ranging from 0.8 to 1.2.

In particular, a material of a surface of the collector mirrors is selected from a group comprising: Mo, Ru, Rh, Pd, U, Ni, W, Fe, Nb, Al, Si, Co and BN.

In an embodiment, the means for debris mitigation include a protective gas flow between ellipsoidal mirror units.

In an embodiment, each of ellipsoidal mirror units comprises a nested set of at least two ellipsoidal mirrors.

In an embodiment, the means for debris mitigation include a debris shield located on an axis of the optical collector outside a collection angle.

In a preferred embodiment of the invention, the means for debris mitigation are provided by one or more techniques comprising: protective gas flow, a magnetic mitigation, a foil trap, a membrane made of a material belonging to a group comprising: carbon nanotubes, Ti, Al, Si, Zr, Si, BN, largely transparent to the short-wavelength radiation.

In an embodiment, the membrane is also a gas lock separating volumes with different pressures for providing a protective gas flow.

The technical result of the invention consists in a significant increase of average power, spectral range of collected radiation, efficiency of debris mitigation and life time of compact high-brightness high-stable sources of soft X-ray, EUV and VUV radiation.

The following causal relationships exist between the set of essential features of the present invention and the achieved technical result.

The use in a LPP light source with a fast rotating liquid-metal target of an optical collector with two ellipsoidal mirror units allows (as opposed to using of multilayer mirrors of normal incidence), firstly, to significantly increase the solid angle of collection of short-wavelength radiation (collection angle), secondly, to significantly to expand the spectral range of the collected radiation; thirdly, to transfer the image of the plasma source to an intermediate or remote focus without aberrations.

An increase in the collection angle and spectral range of the optical collector leads to a significant (several times) increase in the output power of the LPP light source. Also, the use grazing incidence mirrors in the optical collector allows increasing the region for locating means for debris mitigation in the pathway of output beam, thereby extending lifetime of optical collector.

In addition, the use of grazing incidence mirrors in the optical collector makes it possible to increase the region of placement of the means for debris mitigation along the propagation path of the output beam, thereby increasing the life time of the optical collector.

All of the above provides for improving the operating efficiency of high-brightness LPP light sources in practically all applications.

The present invention combines the advantages of LPP light sources based on a fast rotating target and the wide range of available target materials with an optical collector based on grazing incidence mirrors.

The crucial role in the contamination of collector optics in LPP light sources of various types belongs to the droplet fraction of debris particles ejecting from the interaction zone at a relatively low velocity which is efficiently mitigated in accordance the invention due to a fast target's rotation (hundreds of Hz at a linear velocity of over 100 m/s) providing redirecting the overwhelming part of droplets sideways from the optical collector and input window for laser beam. At the same time, the optical collector based on grazing incidence mirrors provides highly efficient collecting short-wavelength radiation in a wide solid angle (up to a few tenths of steradians) and in a wide spectral range (from 0.4 to 120 nm) and enabling highly effective protection of mirrors against all types of debris particles.

Along with this, the use of not only liquid metal, but also any liquid and/or free-flowing target materials significantly expands their choice and makes it possible to generate radiation from laser produced plasma in different spectral bands, selected in a wide spectral range from 0.4 to 120 nm.

The advantages and features of the present invention will become more apparent from the following non-limiting description of exemplary embodiments thereof, given by way of example with reference to the accompanying drawings.

BRIEF DESCRIPTION OF THE DRAWINGS

The essence of the invention is illustrated by drawings, in which.

In the drawings, the matching elements of the device have the same reference numbers.

These drawings do not cover and, moreover, do not limit the entire scope of the options for implementing this technical solution, but represent only illustrative material of a particular case of its implementation.

DETAILED DESCRIPTION OF THE PREFERRED EMBODIMENTS

Figure 1:
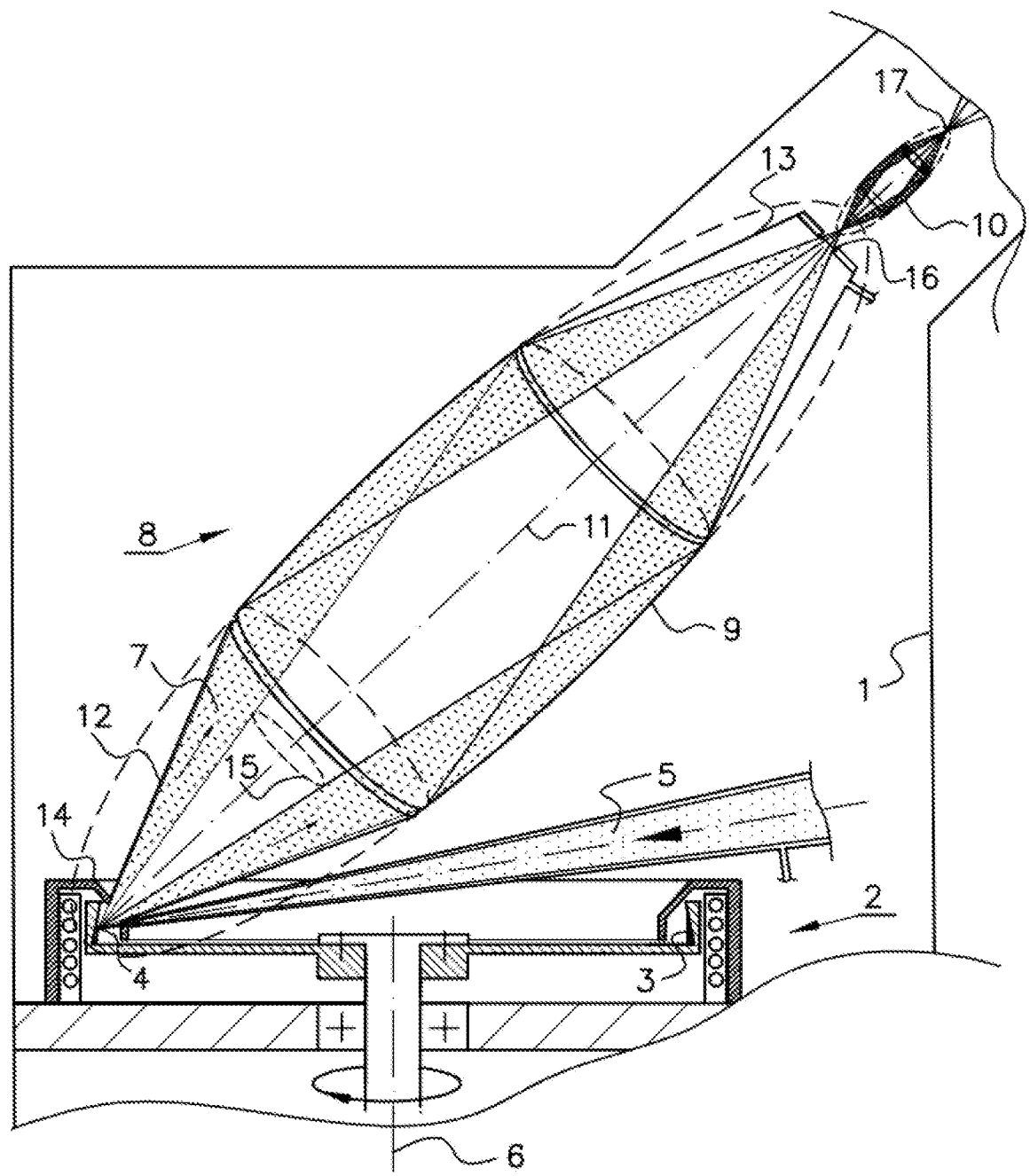
FIG. 1 shows schematic diagram of high brightness LPP light source with an optical collector comprised of two ellipsoidal grazing incidence mirror units in accordance with an embodiment.

According to an example of invention embodiment illustrated in FIG. 1, the high-brightness source of short-wavelength radiation contains a vacuum chamber 1 with a rotating target assembly 2, which supplies target 3 to the interaction zone 4 with a focused laser beam 5. A part of the rotating target assembly 2 is made in the form of a disk fixed to the rotation shaft. Said disk has a peripheral portion in the form of an annular barrier with the annular groove facing the rotation axis 6. The target 3 is a layer of target material, preferably molten fusible metal, formed by centrifugal force on the surface of the annular groove of the rotating target assembly 2.

The annular groove configuration prevents material of the target 3 from being ejected in the radial direction and in both directions along the rotation axis 6, if the target material volume does not exceed the groove's volume.

To ensure high stability of both the target surface and output parameters of LPP light source, a fast rotating speed at a centrifugal acceleration of not less than 3000 g is employed whereby the effect of the centrifugal force makes the surface of the liquid metal or fluid target 3 parallel to the rotation axis 6, i.e. it is essentially a circular cylindrical surface whose axis coincides with the rotation axis.

In the interaction zone 4, under the action of a focused laser beam 5, a pulsed high-temperature plasma of the target material is generated. The plasma generates short-wavelength radiation in one or more spectral ranges, which include VUV, EUV, and soft X-rays. Used short-wavelength radiation leaves the interaction zone 4 in the form of a diverging output beam 7 to the optical collector 8.

In accordance with the invention, the collection of short-wavelength radiation is carried out by an optical collector 8 containing two units 9, 10 of grazing incidence ellipsoidal mirrors. Ellipsoidal mirror units 9, 10 are arranged on one common optical axis 11, preferably in tandem along the path of propagation of the output beam 7. The interaction zone 4 is located in the first focus of the first ellipsoidal mirror unit 9, and the second focus of the first unit 9 coincides with the first focus of the second ellipsoidal mirror unit 10. In this case, the image of emitting plasma region in the interaction zone 4 is projected into the zone of the second focal spot 17 of the second ellipsoidal mirror unit 10 essentially without distortion.

On the path of the output beam 7 along the optical axis 11 of the optical collector 8, there are means for debris mitigation 12, 13, 14, 15, 16 provided by one or more techniques comprising:

the debris shields 14, 15 installed outside the collection angle and cone of focused laser beam 5;

the flows of protective gas directed along and/or perpendicular to the optical axis 11 of the optical collector 8 to suppress the vapor fraction of debris;

a foil trap, highly transparent for plasma radiation which is essentially a system of plates oriented in radial directions with respect to the plasma, providing a sufficiently effective trapping of neutral atoms and clusters of the target material;

a magnetic field preferably generated by permanent magnets to mitigate the charged fraction of debris particles;

a preferably replaceable membrane 16 essentially transparent for short-wavelength radiation and impermeable for debris and gas.

Similar means for debris mitigation are placed in the propagation path of the focused laser beam 5.

According to the present invention important advantages are achieved as compared to LPP light sources using an optical collector based on normal incidence mirrors where a significant part of the region between the interaction zone and the optical collector is occupied by the zone of propagation of the reflected beam of short-wavelength radiation. Consequently, in such sources the region for placement of means for debris mitigation is very much restricted. According to the present invention, essentially in the entire region between the interaction zone 4 and the optical collector 8 there are placed the means for debris mitigation 12, 14. These means are partially located inside and outside the casings which surround the beams 5, 7 of laser and short-wavelength radiation. All this provides highly effective debris mitigation.

The rigidly mounted debris shield 14 surrounding the interaction zone 4 and the rotating target is separated from the rotating target assembly 2 by a slit gap. The debris shield 14 has only two small openings (for introducing the focused laser beam and for outputting the short-wavelength radiation beam) through which debris particles can exit the target assembly. In the preferred embodiments of invention these openings are also used for directing flows of protective gas into the interaction zone 4.

The output beam 7 having passed through the section of the means for debris mitigation 12 hits the collector mirror of the first unit 9 which can consist of a few embedded coaxial ellipsoid mirrors so that their focuses coincide. In the zone between the first and second ellipsoidal mirror unit there is preferably the second section of the means for debris mitigation 13 which is used for feeding the protective gas, preferably argon, by means of a row of nozzles installed around the optical axis. Thereby this zone becomes a pressurized zone which serves as an additional gas shield in the way of debris propagation into the second ellipsoid mirrors unit 10 and into the equipment integrated with the LPP light source. This gas is evacuated through an annular branch pipe which is also located in this zone (not shown). Moreover, membrane 16 may be installed here, which on the one hand additionally restricts the flow of contaminating particles, and on the other hand separates zones with different pressures of protective gas. The membrane is preferably made of a material belonging to the group which includes carbon nanotubes (CNT), Ti, Al, Si, ZrSi, BN.

After being reflected by mirrors of the first unit 9 the short-wavelength radiation is focused in the second focal spot of the first unit 9 and hits the mirror of the second unit 10 which reflects the short-wavelength radiation into the second focal spot 17 of the second ellipsoidal mirror unit 10.

Figure 2:
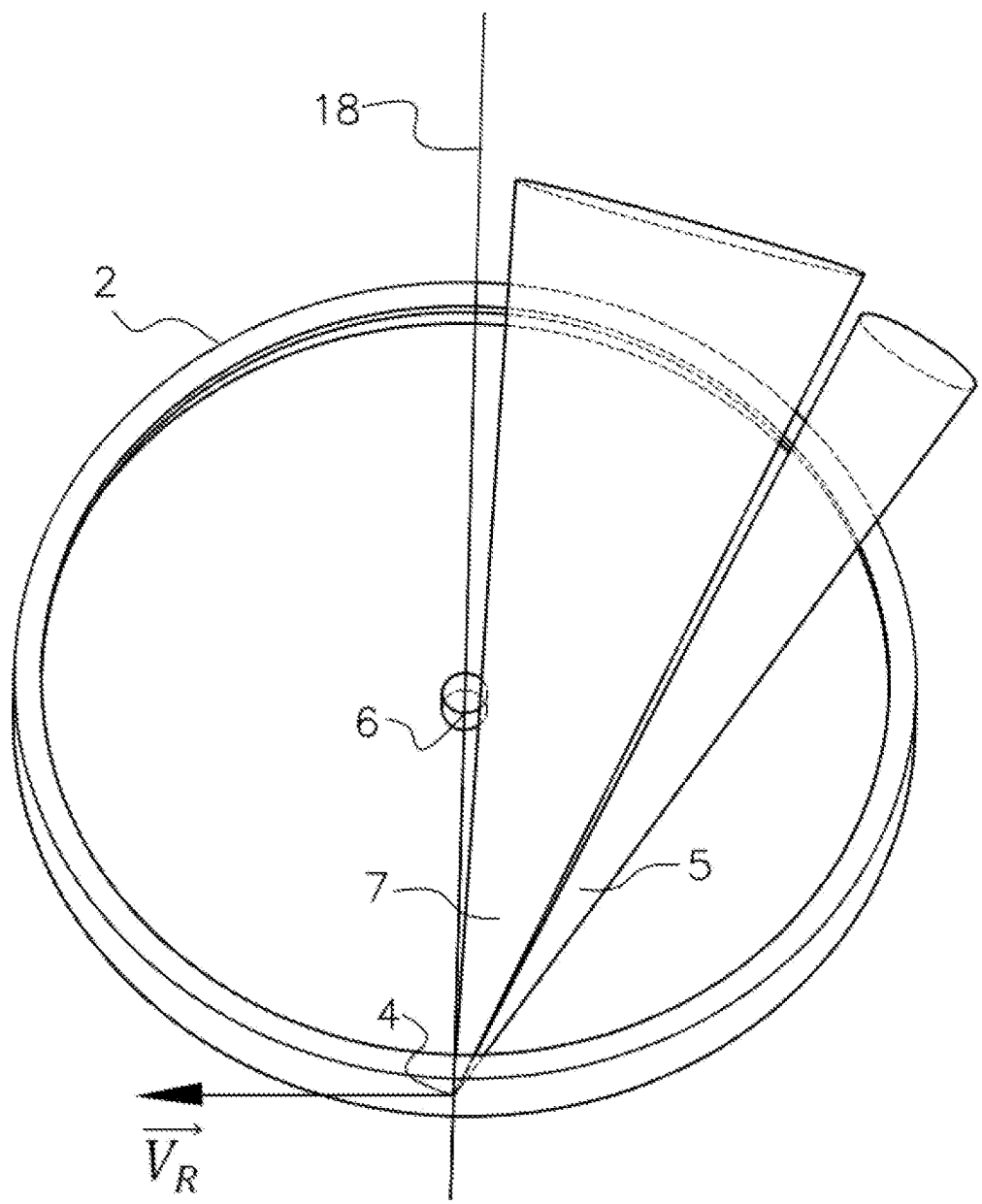
FIG. 2 shows simplified schematic of a high brightness LPP light source in accordance with the embodiment.

In order to amplify the effect of mitigation the droplet fraction of debris particles, the output beam 7 is directed to the other side of the plane 18 passing through the interaction zone 4 and the rotation axis of the target assembly 6, from the vector of the linear velocity of the target $\vec{V}_R$ in the interaction zone 4, as shown in FIG. 2. Both laser beam 5 and output beam 7 are located on one side of the said plane 18. Accordingly, the vector $\vec{V}_R$ and beams 7, 5 of short-wavelength and laser radiation are located on different sides of the plane 18.

This statement is illustrated by the results of computational modeling of spatial distribution of debris ejection from the interaction zone 4 performed by RZLINE code which is created for applications in the field of radiation hydrodynamics of dense hot plasma. The code uses mathematical models based on years of experimental and theoretical work as, for example, it is known from the publication K. Koshelev, V. Ivanov, V. Medvedev, et al "Return-to-zero line code modeling of distributed tin targets for laser-produced plasma sources of extreme ultraviolet radiation", Journal of Micro/Nanolithography, MEMS, and MOEMS Vol. 11, Issue 2 (May 2012). The code allows modeling the interaction of laser radiation with gases, liquids and solid surfaces with subsequent generation of plasma, as well as interaction with the plasma itself.

Figure 3:
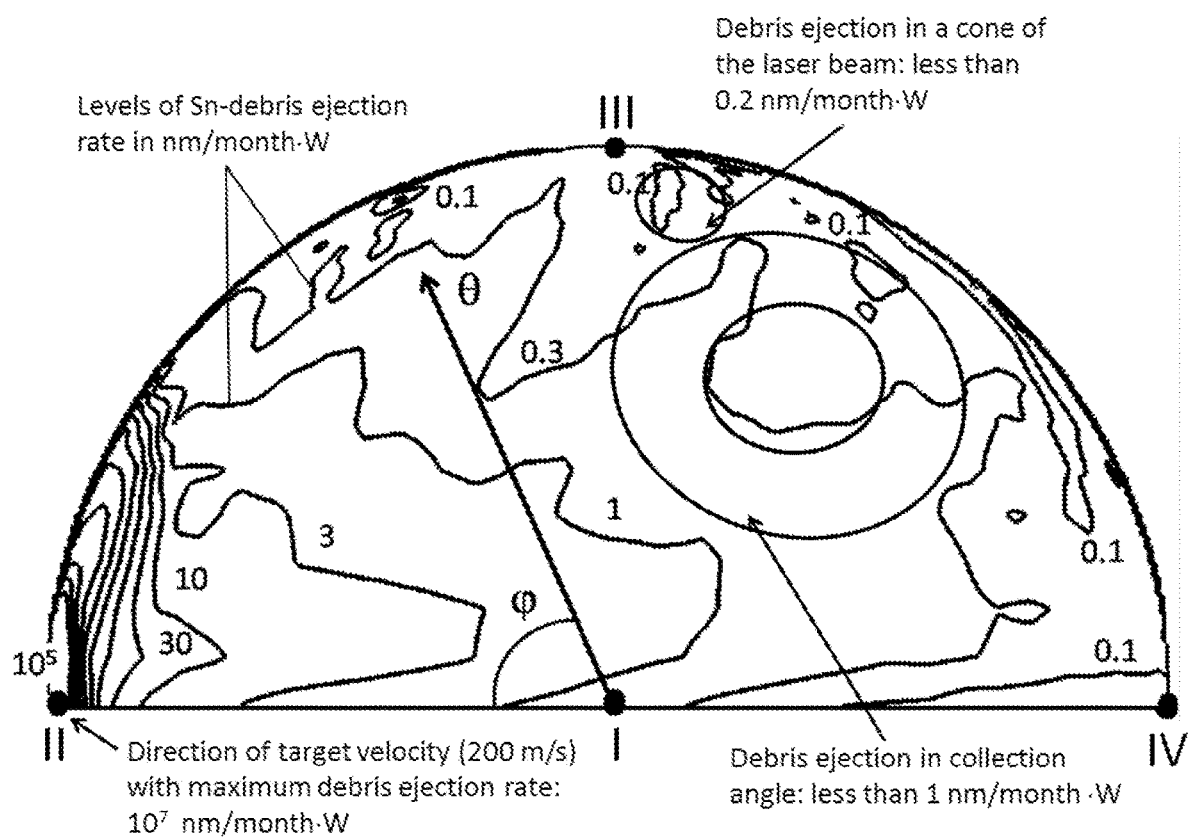
FIG. 3 shows the results of calculating the spatial distribution of debris ejection from the interaction zone, illustrating the choice of spatial regions for the propagation of laser and short-wavelength radiation beams.

FIG. 3 shows a map of the spatial distribution of ejection rates of debris particles (particles of all fractions of all velocities are taken into account) in experimental coordinates, in which θ—is the angle to rotation axis («polar angle»), φ—is angle to the vector of target velocity in the plane of rotation («azimuthal angle»). The origin of coordinates is in the interaction zone. Typical directions in the interaction zone are as follows:

I—parallel to the rotation axis: θ=0, φ—any,
II—along target velocity: θ=90°, φ=0°,
III—normal to the target surface: θ=90°, φ=90°,
IV—against target velocity: θ=90°, φ=180°.

Shown in FIG. 3 spatial distribution of the debris ejection rate was calculated in nm/(month·W) as a specific growth rate of the film thickness of deposited debris particles on a surface of the exposed sample located at a distance of 40 cm from the interaction zone per unit of laser power. Apart from the fast target rotation no other debris mitigation techniques were used.

This distribution was obtained for typical values of the light source parameters: the target material is tin, the laser radiation wavelength is ~1-2 μm, the laser pulse energy is several mJ at pulse duration of several ns, the focal spot diameter is several tens of μm and the target linear velocity is 200 m/s.

As illustrated in FIG. 3, the mass of debris particles is mainly concentrated in the sector along the direction of the target velocity limited by the «azimuth angles» φ of 0°-80° and by the «polar angles» θ of 0°-90°. Maximum debris ejection rate along the direction of the target rotation is 107 nm/month·W. In FIG. 3 ovals are used to indicate the spatial direction where the cones of laser and output beams are located, whereby the estimated debris ejection rate in the laser cone is less than 0.2 nm/month·W, while in the short-wavelength radiation cone it is less than 1 nm/month/W (the shown cone approximately corresponds to the solid angle of 0.3 sr). The data are provided assuming the power of laser radiation is 1 W and the source is used 24/7.

The high-brightness laser-produced plasma light source is operated as described below and illustrated by FIG. 1, FIG. 2 and FIG. 3.

The vacuum chamber 1 is evacuated using the oil-free vacuum pump system to the pressure below $10^{-5} \ldots 10^{-11}$ mbar. At the same time, gas components, such as nitrogen, oxygen, carbon, etc., capable of interacting with the target material and of contaminating the collector mirror, are removed.

The target material which belongs to the group of non-toxic fusible metals including Sn, Li, In, Ga, Pb, Bi, Zn and alloys thereof is transferred into molten state and sustained in the pre-defined optimum temperature range using a fixed heating system which may employ induction heating.

The rotating target assembly 2 is actuated using the rotating drive unit, for example, an electric motor with a magnetic coupling, which ensures cleanliness of the vacuum chamber 1. Under the action of the centrifugal force, the target 3 is formed as the layer of fluid target material on the surface of the annular groove facing the rotation axis 6. At a centrifugal acceleration of at least 3000 g the target surface is substantially parallel to the rotation axis.

The target 3 is exposed to the focused laser beam 5 with a high pulse repetition rate that can be in the range of 1 kHz to 5 MHz. Short-wavelength radiation is generated by the focused laser beam 5 heating the target material to a plasma-forming temperature. The laser-produced plasma emits light in the short-wavelength range including wavelengths of 0.4 to 120 nm. Depending on the laser radiation power density in the focal spot and the target material, short-wavelength radiation is generated mainly in the soft X-ray (0.25-10 nm) and/or EUV (10-20 nm) and/or VUV (20-120 nm) range.

Heat transfer from the target is ensured via the narrow gap between the rotating target assembly 2 and the fixed water-cooled heat exchanger (not shown) through which gas is blown at the pressure of ~1 mbar. Gas conductivity and area of contact are sufficient to remove up to 1.5 kW of thermal power for this type of cooling. At the same time, other cooling methods may be used for the rotating target assembly 2.

The dense high-temperature laser-produced plasma formed in the interaction zone 4 emits the short-wavelength radiation. The output beam 7 is coming out of the high-temperature plasma through the means for debris mitigation 12, 13, 14, 15, 16 into an optical collector based on two coaxial ellipsoidal mirror units 9, 10. Due to fast target rotation, the droplet fraction of debris particles ejecting from the interaction zone acquires a significant tangential velocity component comparable to the linear target velocity, FIG. 2. Accordingly, the resulting vector of the droplets velocity will be largely redirected from the cones of laser beam 5 and output beam 7 since the vector of the target's linear velocity $\vec{V}_R$ in the interaction zone and said beams 5, 7 are positioned on different sides of the plane 18 passing through the interaction zone 4 and the rotation axis 6.

The first ellipsoidal mirror unit 9 transmits the image of the emitting plasma region from the interaction zone positioned in the first focus of the first ellipsoidal mirror into the second focus. Due to the different gain factors of different portions of the ellipsoidal mirror the resulting image of the emitting plasma is strongly distorted in the intermediate focus between two mirror units 9, 10. Along with that, second ellipsoidal mirror unit 10, the first focus of which coincides with the second focus of the first ellipsoidal mirror unit 9, provides for eliminating said image distortions. Thus, in the second focus of the second ellipsoidal mirror unit 10 the plasma image is projected without distortions with an scale factor defined by a design of the first and second ellipsoidal mirror units 9, 10.

In the embodiment of the invention the optical collector 8 has magnification close or equal to 1, ranging from 0.8 to 1.2. In the preferable embodiment the second ellipsoid mirror unit 10 is several times, from 2 to 15 times, smaller than the first ellipsoid mirror unit 9. This is due to the fact that though the collection angle is the same, there is no need to reserve much space in front of the second mirror for debris mitigation means. This configuration allows making the optical collector assembly more compact and less expensive. The means for debris mitigation which can be used to protect the second mirror unit 10 and the downstream optics can comprise:

- the debris shield 15 positioned outside the collection angle;
- the replaceable semi-transparent membrane 16;
- the protective gas flow supplied through nozzles in front of the second focus of the first mirror unit 9, preferably positioned on a circle relative to the optical axis 11 and the annular branch pipe for gas evacuation, so that a gas curtain is created in the zone in front of the second focus of the first mirror unit.

When the integral amplification of the optical collector is close to 1, an undistorted image of the plasma source with the same size is obtained in the second focus 17 of the second unit of the optical collector.

Depending on the operating range of wavelengths and the collection angle, one of the following materials with relatively high grazing incidence reflectivity can be selected as the reflecting material of grazing incidence ellipsoidal mirrors: Mo, Ru, Rh, Pd, U, Ni, W, Fe, Nb, Al, Si, Co and BN, providing a reflection coefficient of at least 20% at incidence angles of at least 5 degrees in the wavelength range from 2.5 to 120 nm.

Depending on the operating range of wavelengths, any material that can flow under the action of centrifugal force can be selected as the target material.

Preferably, but not limited to, one of the following molten fusible metals can be selected as the target material: Sn, Li, In, Ga, Pb, Bi, Zn and their alloys.

In other embodiments of the invention metal or alloy; powder (20), for example, metal powder or mixtures powder and melt.

Figure 4:
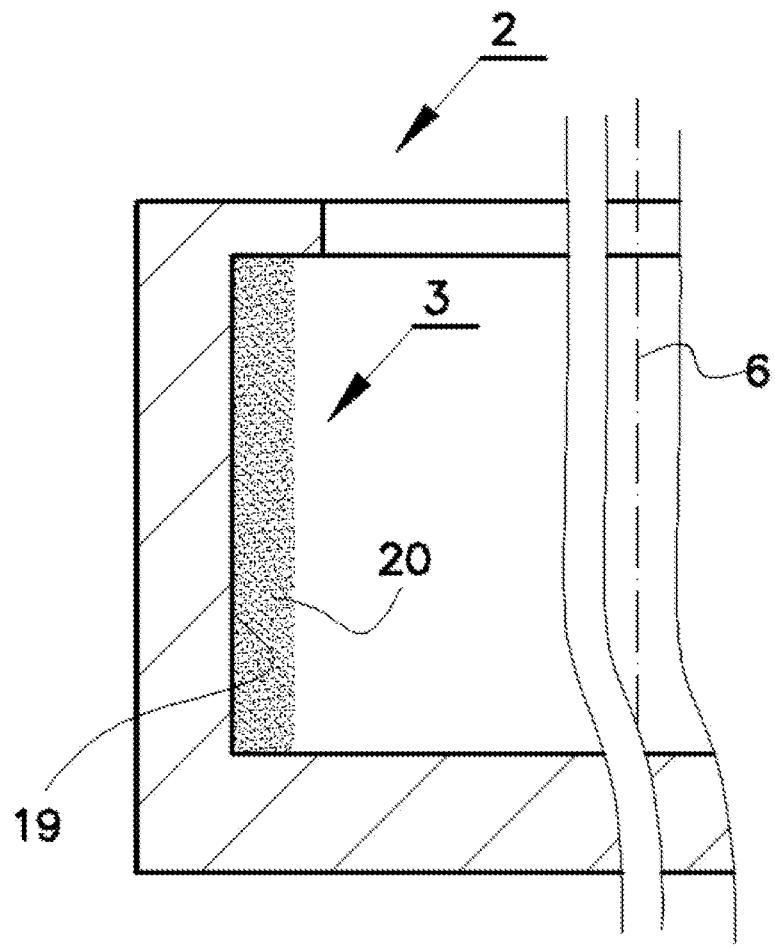
FIG. 4 shows a fragment of a cross-section of a rotating target assembly with a powder target material.

In another embodiment, the target material may be powder 20, such as metal powder, on the surface of the groove 19 implemented in the rotating target assembly 2, FIG. 4. For example, soft X-ray radiation may be generated around central wavelength 6.7 nm using a refractory powder of terbium (Tb) or gadolinium (Gd) as a highly efficient plasma fuel.

Figure 5:
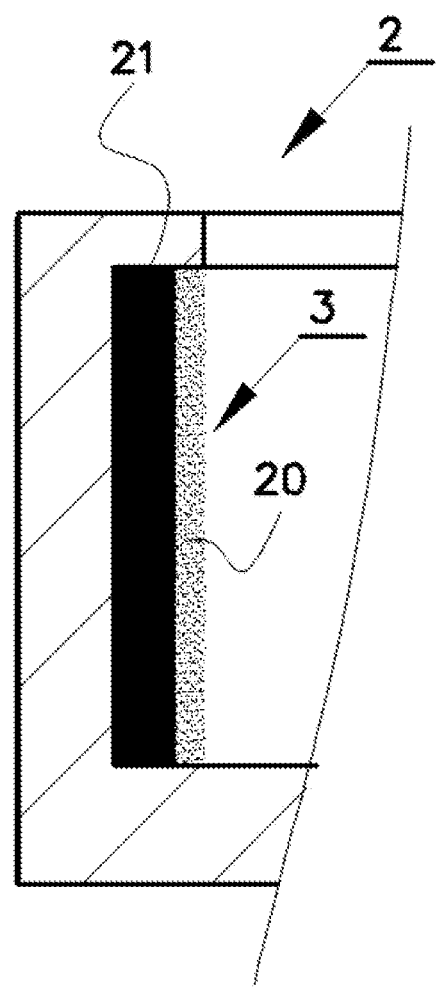
FIG. 5 shows a fragment of a cross-section of a rotating target assembly with the target in the form of a centrifuged mixture of powder and higher density melt.

In yet another embodiment, the target material may be a mixture of denser melt or liquid 21 and powder 20 arranged for laser plasma producing on the inner circular cylindrical surface of the rotating target 3 passing through the interaction zone, FIG. 5.

The method for generating and collecting laser-produced plasma radiation is implemented as described below and illustrated by FIG. 1, FIG. 2 and FIG. 3.

Under the action of centrifugal force, the target is created in the form of a layer of target material on the surface of an annular groove of a rotating target assembly 2, the surface facing the rotation axis. The target is irradiated by a pulsed focused laser beam 5 resulting in the formation of plasma in the interaction zone 4. The output beam is generated passing into an optical collector 8 through the means for debris mitigation 12, 13, 14, 15, 16. The short-wavelength radiation is collected using the optical collector 8 comprising two co-axial ellipsoidal mirror units 9 and 10 which, essentially without distortions transmit an image of the radiating plasma region into the second focus of the second ellipsoidal mirror unit 17, provided that the second focus of the first ellipsoidal mirror unit coincides with the first focus of the second ellipsoidal mirror unit.

The pulsed irradiation of the target is performed in such a manner that the vector $\vec{V}_R$ of the target linear velocity in the interaction zone and beams 5, 7 of laser and short-wavelength radiation are located on different sides of the plane 18 passing through the interaction zone 4 and the rotation axis 6, while the linear velocity of the target is sufficiently high, over 100 m/s, in order to prevent the largest part of the droplet fraction of debris particles from being directed to the optical collector 8 and cone of focused laser beam 5.

A spatial distribution of a debris ejection rate from the interaction zone 4 is calculated and directions of a passage of both focused laser beam 5 and the output beam 7 of short-wavelength radiation are selected in spatial regions with low debris ejection rates.

Spatial regions of the passage of both focused laser beam 5 and the output beam 7 are selected so that a debris ejection rates in said spatial regions are at least $10^4$ times less, preferably $10^6$ times less, than a maximum debris ejection rate.

In addition, the means for debris mitigation are used, comprising protective gas flow, magnets, a foil trap, a membrane 16 largely transparent for short-wavelength radiation, and a debris shields 14, 15.

Thus, the present invention provides for creating LPP sources of soft X-ray, EUV and VUV radiation characterized by a high average power, high brightness of short-wavelength radiation, a long lifetime, and by the ease of use.

INDUSTRIAL APPLICATION

The proposed devices are intended for a number of applications, including microscopy, materials science, X-ray diagnostics of materials, biomedical and medical diagnostics, inspection of nano- and microstructures and lithography, including actinic control of lithographic EUV masks.

What is claimed is:

1. A method of generating and collecting a short-wavelength radiation, comprising: forming a target (3) under an action of a centrifugal force as a layer of a target material on a surface of an annular groove, implemented in a rotating target assembly (2) with a target surface facing a rotation axis (6); irradiating the target (3) at a high pulse repetition rate by a focused laser beam (5) passing through a means for debris mitigation; generating a laser produced plasma in an interaction zone (4) and exiting an output beam (7) of the short-wavelength radiation into an optical collector (8) through the means for debris mitigation (12-16), wherein the target (3) is rotated at a high linear velocity, not less than 100 m/s, so that most of ejected debris particles and a vector ($\vec{V}_R$) of the linear velocity of the target in the interaction zone (4) to be directed on one side of a plane (18) passing through the interaction zone (4) and the rotation axis (6), while the irradiating of the target and collecting radiation from the laser produced plasma are provided so that the focused laser beam (5) and the output beam (7) are located on another side of said plane (18).

2. The method according to claim 1, wherein a spatial distribution of a debris ejection rate from the interaction zone (4) is calculated and directions of a passage of both focused laser beam (5) and the short-wavelength radiation beam (7) are selected in spatial regions with minimal debris ejection rates.

3. The method according to claim 1, wherein spatial regions of the passage of both the focused laser beam (5) and the short-wavelength radiation beam (7) are selected so that a debris ejection rates in said spatial regions are at least $10^4$ times less than a maximum debris ejection rates.

4. The method according to claim 1, wherein the short-wavelength radiation is collected by the optical collector (8) comprising two ellipsoidal mirror units (9, 10) arranged in a tandem that transmits an image of the emitting plasma region without distortions, on a scale determined by a design of said units, into a second focal point (17) of a second ellipsoidal mirror unit (10) while a second focal point of a first ellipsoidal mirror unit (9) is located in a first focal point of the second ellipsoidal mirror unit (10).

5. The method according to claim 4, wherein the debris mitigation is provided along an entire path of the short-wave radiation to the optical collector (8).

6. The method according to claim 1, wherein the debris mitigation is provided by one or more debris mitigation techniques, including: protective gas flow, a magnetic mitigation, a foil trap, a debris shield (14, 15), a membrane (16) mostly transparent for short-wavelength radiation, with a transparency of more than 60%.

7. The method according to claim 1, wherein the target (3) is rotated with a centrifugal acceleration of not less than 3000 g, where g is a gravitational acceleration, the target material has fluidity under centrifugal force, and the target surface is parallel to the rotation axis (6).

8. A laser produced plasma light source, comprising: a vacuum chamber (1), a rotating target assembly (2) supplying a target (3) into an interaction zone (4) with a pulsed laser beam (5) focused onto the target which is a layer of a target material on a surface of an annular groove (19) implemented in the rotating target assembly (2) with a target surface facing a rotation axis (6), an output beam (7) of a short-wavelength radiation exiting the interaction zone to an optical collector (8), and means for debris mitigation (12-16), wherein a linear velocity of the target (3) is not less than 100 m/s, a vector ($\vec{V}_R$) of the linear velocity of the target in the interaction zone (4) is directed on one side of a plane (18) passing through the interaction zone (4) and the rotation axis (6), while the focused laser beam (5) and the output beam (7) are located on another side of said plane (18).

9. A laser produced plasma light source, comprising: a vacuum chamber (1), a rotating target assembly (2) supplying a target (3) into an interaction zone (4) with a pulsed laser beam (5) focused onto the target which is a layer of a target material on a surface of an annular groove (19) implemented in the rotating target assembly (2) with a target surface facing a rotation axis (6), an output beam (7) of a short-wavelength radiation exiting the interaction zone to an optical collector (8), and means for debris mitigation (12-16), wherein the target material has fluidity under centrifugal force and belongs to a group comprising: a liquid (21), including molten metal; a powder (20), including metal powder or mixtures thereof.

10. The source according to claim 9, wherein the target (3) is formed at a centrifugal acceleration of at least 3000 g and the surface of the target (3) is parallel to the rotation axis (6).

11. The source according to claim 9, wherein the target material comprises a centrifuged mixture of the powder (20), material of which is arranged for laser plasma producing and the liquid or a melt (21), a density of which is greater than a density of the powder material.

12. A laser produced plasma light source, comprising: a vacuum chamber (1), a rotating target assembly (2) supplying a target (3) into an interaction zone (4) with a pulsed laser beam (5) focused onto the target which is a layer of a target material on a surface of an annular groove implemented in the rotating target assembly (2) with a target surface facing a rotation axis (6), an output beam (7) of a short-wavelength radiation exiting the interaction zone to an optical collector (8), and means for debris mitigation (12-16), wherein
the optical collector (8) comprises two ellipsoidal mirror units (9, 10) arranged in a tandem along a path of the output beam (7), while the means for debris mitigation (12, 14, 15) are located along an entire path of the short-wave radiation into the optical collector.

13. The source according to claim 12, wherein the interaction zone (4) is located in a first focal point of the first ellipsoidal mirror unit (9) and a first focal point of the second ellipsoidal mirror unit (10) is located in a second focal point of the first ellipsoidal mirror unit (9).

14. The source according to claim 12, wherein the second ellipsoid mirror unit (10) is several times, from 2 to 15 times, smaller than the first ellipsoid mirror unit (9) and the optical collector (8) has magnification close to 1, ranging from 0.8 to 1.2.

15. The source according to claim 12, wherein a material of a surface of the collector mirrors is selected from a group comprising: Mo, Ru, Rh, Pd, U, Ni, W, Fe, Nb, Al, Si, Co and BN.

16. The source according to claim 12, wherein the means for debris mitigation (12, 13) include a protective gas flow between the ellipsoidal mirror units (9, 10).

17. The source according to claim 12, wherein the means for debris mitigation (12, 13) include a debris shield (15) located on an axis (11) of the optical collector outside a collection angle.

18. The source according to claim 12, wherein each of ellipsoidal mirror units (9, 10) comprises a nested set of at least two ellipsoidal mirrors.

19. The source according to claim 12, wherein the means for debris mitigation (12-16) are provided by one or more techniques comprising: protective gas flow, a magnetic mitigation, a foil trap, a membrane (16) made of a material belonging to a group comprising: carbon nanotubes, Ti, Al, Si, Zr, Si, BN, mostly transparent to the short-wavelength radiation.

20. The source according to claim 19, wherein the membrane (16) is also a gas lock separating volumes with different pressures for providing a protective gas flow.

* * * * *